(12) United States Patent
Kubota et al.

(10) Patent No.: US 7,951,513 B2
(45) Date of Patent: May 31, 2011

(54) PELLICLE AND METHOD FOR PRODUCING PELLICLE

(75) Inventors: Yoshihiro Kubota, Gunma (JP); Shoji Akiyama, Gunma (JP); Toshihiko Shindo, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/434,021

(22) Filed: May 1, 2009

(65) Prior Publication Data
US 2009/0274962 A1 Nov. 5, 2009

(30) Foreign Application Priority Data
May 2, 2008 (JP) ................................. 2008-120664

(51) Int. Cl.
*G03F 1/00* (2006.01)
*A47G 1/12* (2006.01)
(52) U.S. Cl. .............................................. 430/5; 428/14
(58) Field of Classification Search .......... 430/5; 117/8, 117/104, 200; 250/492.2; 355/30, 67; 438/458, 438/478
See application file for complete search history.

(56) References Cited

U.S. PATENT DOCUMENTS

| | | | |
|---|---|---|---|
| 5,935,733 A * | 8/1999 | Scott et al. ......................... | 430/5 |
| 6,197,454 B1 | 3/2001 | Yan | |
| 6,623,893 B1 * | 9/2003 | Levinson et al. .................. | 430/5 |
| 2003/0228529 A1 * | 12/2003 | Dieu et al. ......................... | 430/5 |
| 2005/0048380 A1 * | 3/2005 | Nagata ............................... | 430/5 |
| 2006/0281283 A1 * | 12/2006 | Yoshida et al. ................ | 438/478 |
| 2009/0104544 A1 * | 4/2009 | Kubota et al. ...................... | 430/5 |
| 2009/0291372 A1 * | 11/2009 | Kubota et al. ...................... | 430/5 |

FOREIGN PATENT DOCUMENTS
GB 2 121 980 A 1/1984

OTHER PUBLICATIONS

U.S. Appl. No. 12/466,042, filed May 14, 2009, Kubota, et al.
Yashesh A. Shroff, et al., "EUV Pellicle Development for Mask Defect Control", Emerging Lithographic Technologies X, Proc. of SPIE vol. 6151 615104-1, 2006, 10 pages.
Isao Yamada, "Cluster Ion Beam Tecnology", chapter 4, Nikkan Kogyo Shimbun Ltd., Original Copy in Japanese, 41 pages and English translation of pp. 176-179, 3 pages.

(Continued)

*Primary Examiner* — Stephen Rosasco
*Assistant Examiner* — Stewart A Fraser
(74) *Attorney, Agent, or Firm* — Oblon, Spivak, McClelland, Maier & Neustadt, L.L.P.

(57) ABSTRACT

A silicon single crystal film having a crystal plane as its principal plane, the crystal plane being inclined at 3 to 5° from any lattice plane belonging to {100} planes or {111} planes is used as a pellicle film. The silicon single crystal having such a crystal plane as its principal plane has effective bond density and Young's modulus thereof which are about 40% to about 50% higher than those of a silicon single crystal with <100> orientation, and therefore a cleavage and crack do not easily occur. Moreover, the silicon single crystal has a high chemical resistance such as hydrofluoric acid resistance, and hardly causes an etch pit and void. Accordingly, the present invention can provide a pellicle comprising a pellicle film for EUV having high transmission, and excellent mechanical and chemical stability, as well as having a high yield, and being practical also in cost.

20 Claims, 3 Drawing Sheets

OTHER PUBLICATIONS

Fumio Shimura, "Semiconductor Silicon Crystal Technology", ("Structure of the Silicon Atom"), Chapter 2, Paragraph 2.2, Academic Press, Inc. (1989), cover page and pp. 19-22, Published 1989.

Fumio Shimura, "Semiconductor Silicon Crystal Technology", ("Basic Crystallography"), chapter 3, Academic Press, Inc. (1989), pp. 21-82, Published 1989.

* cited by examiner

PELLICLE AND METHOD FOR PRODUCING PELLICLE

This application claims priority from Japanese Patent Application No. 2008-120664 filed May 2, 2008, which is incorporated hereinto by reference in its entirely.

BACKGROUND OF THE INVENTION

1. Field of the Invention

The present invention relates to a pellicle for lithography. More particularly, the present invention relates to a pellicle suitable for lithography using extreme ultra violet (EUV) light, and a method for producing the same.

2. Description of the Related Art

With high integration of semiconductor devices, patterns formed by lithography are microminiaturized, and currently devices having a pattern width of about 45 nm are being put to practical use. Such a narrow line pattern can be realized by lithography based on a manner such as an ArF immersion method and a double exposure method which are improved techniques of conventional excimer exposure technologies.

However, in such lithography based on the excimer exposure technologies, it is regarded as difficult to meet patterning requiring further miniaturization with a pattern width of 32 nm or less. Therefore, lithography using extreme ultra violet (EUV) light has attracted attention as a new exposure technology to replace the lithography based on the excimer exposure technologies.

To put to practical use an exposure technology using EUV light having a dominant wavelength of 13.5 nm, it is indispensable to develop not only a light source, but also a new resist, a pellicle, and the like. Among these, development for the light source and resist has been already made substantial progress, whereas for pellicle, many technical problems which have to be solved for realization of a pellicle for EUV remain unsolved.

A pellicle film provided in a pellicle for EUV requires not only a dust-proof function for preventing adherence of foreign matters on a photomask, but also high transmission for EUV light and chemical stability. However, the prospects for resolution of problems of such high transmission and chemical stability, and further the material development for a practical pellicle film having an excellent fabrication yield are still far from certain at present.

Although a transparent material for light in a wavelength range having a dominant wavelength of 13.5 nm is currently not known, silicon has relative high transmittance for the light having such a wavelength, and therefore silicon has attracted attention as a pellicle film material for EUV. As regards this, for example, see Shroff et al. "EUV pellicle Development for Mask Defect Control," Emerging Lithographic Technologies X, Proc of SPIE Vol. 6151 615104-1 (2006) (Non-Patent Document 1) and U.S. Pat. No. 6,623,893 (Patent Document 1).

However, silicon used as a pellicle film in Non-Patent Document 1 is a film deposited by a sputtering method or the like, and therefore necessarily become amorphous, inevitably resulting in the high absorption coefficient and low transmittance in the EUV region.

Although a pellicle film disclosed in Patent Document 1 is also made of silicon, this silicon film is premised on a deposition by CVD method or the like. In this case, the silicon film results in an amorphous or polycrystalline film, and therefore the absorption coefficient in the EUV region inevitably have a high value.

In addition, there are also the following problems: as the pellicle films disclosed in Patent Document 1 and Non-Patent Document 1, a strong stress is easily introduced into a silicon crystal formed by a sputtering or CVD methods, and the above stress easily results in deteriorated and uneven optical film properties.

Thus, the inventors solved the above shortcomings, invented a practical pellicle for EUV having high transmission and excellent chemical stability and a method for producing the same, and then filed an application (Japanese Patent Application No. 2007-293692 (unpublished)).

However, the result of a subsequent further study found the following problems: in the case where a silicon single crystal film having a (100) plane as its principal plane is used as a pellicle film in the invention according to the above patent application, the EUV pellicle has an excellent optical property, and however a crack or defect tends to occur in the silicon crystal film in steps of stripping, etching, handling, and the like when a silicon crystal is made into a thin film in a pellicle production process, thereby decreasing a fabrication yield.

The meaning of signs used to represent a crystal plane and its orientation herein is described in, for example, Fumio Shimura "Semiconductor Silicon Crystal Technology" Chapter 2, Paragraph 2.2, Academic Press (1989): (Non-Patent Document 2), which is generally used by those skilled in the art.

SUMMARY OF THE INVENTION

The present invention has been made in view of these problems, and an object of the present invention is to provide a pellicle comprising a pellicle film for EUV having high transmission, and excellent mechanical and chemical stability, as well as having a high fabrication yield, and being practical also in cost.

In order to resolve these problems, a pellicle of the present invention comprises: a silicon single crystal film as a pellicle film; wherein the principal plane of the silicon single crystal film is a crystal plane inclined at 3 to 5° from any lattice plane belonging to {100} planes or {111} planes.

For example, the lattice plane belongs to {100} planes, and the crystal plane is inclined at 3 to 5° in the <111> direction. Also, for example, the lattice plane belongs to {111} planes, and the crystal plane is inclined at 3 to 5° in the <110> direction.

Preferably, the silicon single crystal film is obtained by making an SOI substrate into a thin film, and moreover, preferably, has an absorption coefficient of 0.005/nm or less for light having a wavelength of 13.5 nm.

The pellicle of the present invention may comprise a protection film on at least one principal plane of the silicon single crystal film. In this case, preferably, the protection film has an absorption coefficient of 0.05/nm or less for light having a wavelength of 13.5 nm.

Preferably, this protection film consists of at least one material of the group consisting of SiC, $SiO_2$, $Si_3N_4$, SiON, $Y_2O_3$, YN, Mo, Ru, and Rh.

A method of producing a pellicle of the present invention comprises the steps of: providing a pellicle film retaining portion on an SOI substrate that has, on one principal plane, a silicon single crystal film having a crystal plane as its principal plane, the crystal plane being inclined at 3 to 5° from any lattice plane belonging to {100} planes or {111} planes; and forming the silicon single crystal film as a pellicle film by removing a support substrate from the other principal plane side of the SOI substrate.

In this method of producing, the method of producing a pellicle may further comprises the step of forming a protection film on at least one surface of the silicon single crystal film.

In this case, the forming a protection film, for example, is performed by coating a film consists of at least one material of the group consisting of SiC, $SiO_2$, $Si_3N_4$, SiON, $Y_2O_3$, YN, Mo, Ru, and Rh. Moreover, a coating method of the protection film is preferably a gas cluster ion beam evaporation method.

In the present invention, the silicon single crystal film having a crystal plane as its principal plane, the crystal plane being inclined at 3 to 5° from any lattice plane belonging to {100} planes or {111} planes is used as a pellicle film, and therefore this configuration provides stability when various mechanical and chemical treatments such as stripping, polishing and etching at the time of formation of a pellicle are performed, and is able to considerably reduce occurrence of a crack, void, and the like resulting from impact and the like associated with handling. Accordingly, the present invention can provide a pellicle comprising a pellicle film for EUV having high transmission, and excellent mechanical and chemical stability, as well as having a high yield, and being practical also in cost.

DESCRIPTION OF THE PREFERRED EMBODIMENTS

A construction of a pellicle according to the present invention is described below with reference to drawings.

Figure 1A:
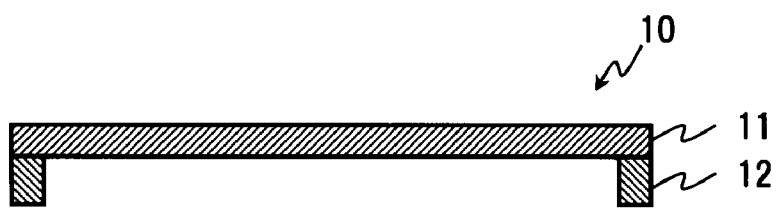
FIGS. 1A and 1B are sectional schematic views for explaining a structural example of a pellicle of the present invention.
Figure 1B:
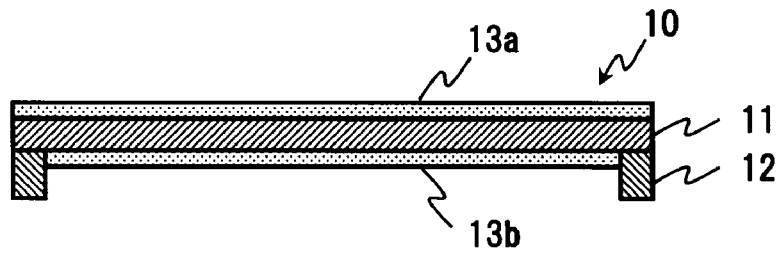

FIGS. 1A and 1B are sectional schematic views for explaining a structural example of a pellicle of the present invention. This pellicle 10 is a pellicle comprising a silicon single crystal film as a pellicle film, in which a pellicle film 11 of the silicon single crystal film having a crystal plane as its principal plane, the crystal plane being inclined at 3 to 5° from any lattice plane belonging to {100} planes or {111} planes, is adhered to an end face of a pellicle frame 12.

The principal plane of such a silicon single crystal film, for example, is a crystal plane with a crystal orientation inclined at 3 to 5° from <100> to <111> direction (inclined at 3 to 5° from a lattice plane belonging to {100} planes to <111> direction), or a crystal plane with a crystal orientation inclined at 3 to 5° from <111> to <110> direction (inclined at 3 to 5° from a lattice plane belonging to {111} planes to <110> direction).

Crystal planes with crystal orientation <111> ({111} plane) include 8 crystal planes with crystal orientation [111], [11-1], [1-11], [-111], [1-1-1], [-11-1], [-1-11], [-1-1-1]. A crystal planes with the crystal orientation <111> may be any one of these crystal planes.

Similarly, <110> direction includes the 12 directions of [110], [-110], [-1-10], [1-10], [011], [0-11], [0-1-1], [01-1], [-101], [101], [-10-1], [10-1].

"shifted 3 to 5° from <111> to <110> direction" refers to, for example, being shifted 3 to 5° in [-110] direction, where the crystal orientation is [111].

Since a silicon single crystal film as the pellicle film 11 is an indirect transition-type semiconductor film, an absorption coefficient in EUV light is relatively lower than that of other material, and suitable for the pellicle film.

According to a study by the inventors, with reference to optical characteristics such as the absorption coefficient of the silicon single crystal films, there is little difference in relative merits resulting from the crystal orientation of its principal plane, while it is found that there is significant crystallographic-orientation-dependence in mechanical characteristics, chemical characteristics, or manufacturing cost such as yield.

As described above, the inventors invented the following and filed a patent application for it: a practical pellicle for EUV having high transmission and excellent chemical stability, in which a silicon single crystal film with (100) plane as its principal plane is used as a pellicle film; and a method for producing the same.

The silicon single crystal with its principal plane having a crystal orientation of <100> has advantages of being relatively mechanically and chemically stable, having high electrical performance, having excellent workability, and having the best balance for semiconductor use, and moreover being low-cost due to the largest quantity production.

However, a crack and defect tend to occur in the silicon crystal film in a process such as stripping, etching, or handling when the silicon crystal is made into a thin film in a pellicle production process. Moreover, silicon single crystal substrates having crystal orientation of <110>, <511> and the like are impractical due to their small production volume and an economic disadvantage.

As a result of a further study by the inventors, a silicon single crystal film is used as the pellicle film, in which its principal plane is a crystal plane inclined at 3 to 5° from any lattice plane belonging to {100} planes or {111} planes like the present invention. The inventors found that this configuration provides stability when various mechanical and chemical treatments such as stripping, polishing and etching at the time of formation of a pellicle are performed, and is able to considerably reduce occurrence of a crack, void, and the like resulting from impact and the like associated with handling.

This is considered to be because the silicon single crystal having the crystal plane as its principal plane, the crystal plane being inclined at 3 to 5° (3° off to 5° off) from any lattice plane belonging to {100} planes or {111} planes, has effective bond density and Young's modulus thereof which are about 40% to about 50% higher than those of a silicon single crystal with <100> orientation, and therefore a cleavage and crack do not easily occur, and has a high chemical resistance such as hydrofluoric acid resistance, and hardly causes an etch pit and void.

On these points, for example, see F. Shimura, "*Semiconductor Silicon Crystal Technology*" Chapter 3, Academic Press, Inc. (1989) (Non-Patent Document 3).

Materials with a low absorption coefficient, such as a silicon single crystal, as the pellicle film material are required because such materials need to have a certain amount of the strength of a film, while transmitting EUV light as far as possible. In particular, this is because transmittance of EUV light (transmittance of light having a wavelength of 13.5 nm)

is made to be 50% or more, for example, in a pellicle film having a thickness of about 20 nm to about 150 nm.

The intensity I of transmitted light of the pellicle film is expressed by the following Equation (1), where the absorption coefficient of the pellicle film is α (nm$^{-1}$), the film thickness is x (nm), and the intensity of incident light is $I_0$.

$$I=I_0 e^{-\alpha x} \quad \text{(Equation 1)}$$

Therefore, the thickness x of a pellicle film necessary to obtain the transmittance of EUV light being 50% or more is estimated to generally 0.693/α and if the absorption coefficient α is 0.005/nm or less, EUV transmittance of 50% can be ensured even if the pellicle film has a thickness of 140 nm. The silicon single crystal is optimum material that meets this requirement.

Preferably, such a pellicle film is made of a SOI film obtained by making an SOI substrate (The term "an SOI substrate" includes an SOQ substrate, and an SOG substrate) into a thin film by a manner described below, for example.

The pellicle 10 of the present invention may be provided with protection films (13a, 13b) on at least one principal plane of the silicon single crystal film which is the pellicle film 11 so as to cover the silicon crystal plane thereof (FIG. 1B).

Such a protection film plays a role in, e.g., preventing oxidation of a surface of the silicon single crystal film due to light from a high power light source. The protection films may include a ceramics film such as SiC, $SiO_2$, $Si_3N_4$, SiON, $Y_2O_3$, and YN, and a metal film such as Mo, Ru, and Rh. Moreover, the protection film may be a film of material obtained by combination thereof, or a film with a plurality of films laminated.

A forming method of the protection film is not particularly limited, and a film may be formed by a well-known CVD method, a sputtering method, an electron beam evaporation method, and the like, and however a gas cluster ion beam (GCIB) evaporation method enables formation of a closely packed protection film having a density close to the theoretical density, and have potential for obtaining high oxidation resistance even if a film are thin ("Cluster Ion Beam Technology", written and edited by Isao Yamada, chapter 4, Nikkan Kogyo Shimbun Ltd. (Non-Patent Document 4)).

Therefore, a GCIB evaporation method is suitable as the forming method of the protection film without decreasing a significant transmittance as a pellicle.

Since the protection film is easily formed relatively thin, its absorption coefficient does not have to be as low as a pellicle film, but preferably, its absorption coefficient for light having a wavelength of 13.5 nm is 0.05/nm or less. With the protection film provided, a thickness or the like of both films is designed such that the transmittance of EUV light passing through the above protection film and the pellicle film is 50% or more.

The silicon single crystal may be selected as material of the pellicle frame 12. A silicon single crystal has advantages of a high purity and being able to also ensure its mechanical strength, and further being able to also suppress dust generation when the pellicle frame is employed.

When a transmissive film (the pellicle film and the protection film) gets soiled and a crack occurs therein, it is necessary to replace the above transmissive film. Thus, preferably, detachment and attachment of the transmissive film can be easily performed.

Therefore, preferably, bonding of the pellicle frame and the base substrate is not made by a fixing implement using a general adhesive or solder, but made by a detachable and attachable mechanical fixing implement such as an adhesive, a magnet, an electrostatic chuck, or a hook. Preferably, such a mechanical fixing member has a property that does not easily degenerate due to irradiation of EUV light, or is provided so as to be shielded from EUV light.

EUV exposure is performed under vacuum, while work for attaching the pellicle to the photomask is usually performed under ordinary pressure. For this reason, the pellicle frame is desirably provided with a pressure adjusting mechanism.

Such a pressure adjusting mechanism needs to be a structure so as to prevent foreign matters from mixing therein when gas flows into or out of the structure. Therefore, it is preferable to provide a filter such as ULPA, which can capture even extremely fine foreign matters, on the pressure adjusting mechanism. In such a filter, it is important to have an area to prevent a transmissive film from expanding and contracting, or from breaking, by an uneven differential pressure.

Example 1

FIGS. 2A to 2D and FIGS. 3A to 3D are views for explaining a process example of a method of producing a pellicle of the present invention. FIGS. 2A to 2D are the views for explaining the process example with an SOQ (Silicon On Quartz) substrate or an SOG (Silicon On Glass) substrate used as an SOI substrate in a broad sense. FIGS. 3A to 3D are the views for explaining the process example with an SOI (Silicon On Insulator) substrate in a limited sense used as an SOI substrate in a broad sense.

In the case where the SOI substrates in a broad sense are an SOQ (Silicon On Quartz) substrate and an SOG (Silicon On Glass) substrate, support substrates 1 were a quartz substrate and a glass substrate, respectively. A support substrate 1 of the SOI (Silicon On Insulator) substrate in a limited sense was a substrate provided with, on its surface, an oxide film 1b on a silicon substrate 1a.

The principal planes of these support substrates each were provided with a silicon single crystal film 2 having a crystal plane as its principal plane, the crystal plane being inclined at 3 to 5° from a lattice plane belonging to {111} planes. The silicon single crystal film 2 was configured as a pellicle film. Each silicon single crystal film 2 provided on the support substrate was a film having an absorption coefficient of EUV light of generally 0.0015 nm$^{-1}$ and a film thickness of about 70 nm.

The silicon substrate 1a, which was the support substrate of the SOI substrate, was, for example, a generally available single-crystal silicon substrate grown by CZ method (Czochralski method). The oxide film 1b was previously formed on a surface of the single-crystal silicon substrate 1a with dimensions of about 100 nm by a process such as thermal oxidation, and the single-crystal silicon crystal film having a crystal plane as its principal plane, the crystal plane being inclined at 3 to 5° from a crystal orientation <111> to <110> direction, was formed thereon as the SOI layer.

Figure 2A:
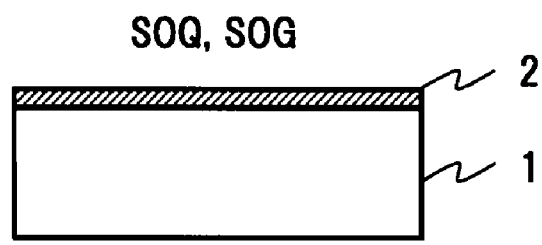
FIGS. 2A to 2D are views for explaining a process example of a method of producing a pellicle of the present invention with an SOQ substrate or an SOG substrate used as an SOI substrate in a broad sense.
Figure 2B:
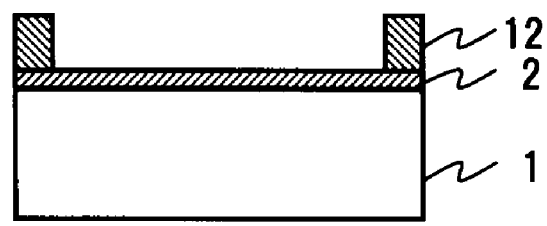
Figure 2C:
Figure 2D:
Figure 3A:
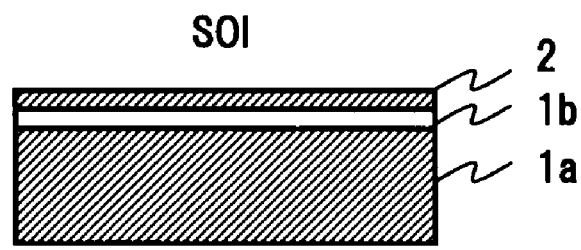
FIGS. 3A to 3D are views for explaining a process example of a method of producing a pellicle of the present invention with an SOI substrate in a limited sense used as an SOI substrate in a broad sense.
Figure 3B:
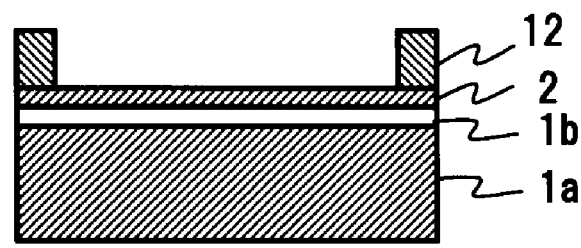
Figure 3C:
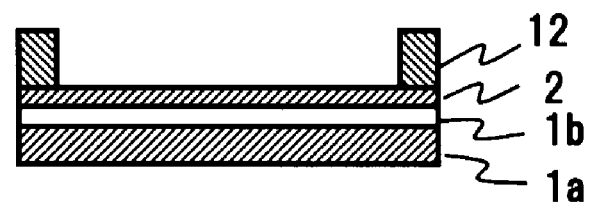
Figure 3D:

These SOQ substrate, the SOG substrate, and the SOI substrate were rectangular substrates having a short side of 122 mm and a long side of 149 mm, and a pellicle frame 12 of the silicon single crystal was adhered to the silicon single crystal film 2 on the front surface side of the rectangular substrates (FIG. 2B and FIG. 3B). Then, by applying polishing and etching from the back surface side of the support substrate (FIG. 2C and FIG. 3C), the pellicle film 11 of the silicon single crystal film retained by the pellicle frame 12 was obtained (FIG. 2D and FIG. 3D).

This pellicle frame 12 had a height of 7 mm and a thickness of 2 mm, and was provided with a plurality of ULPA filter mounting openings on its side, and a groove having a width of 1 mm and a depth of 2 mm was formed in an outermost periphery on the back surface.

When the support substrate is the SOQ substrate or the SOG substrate, the support substrate 1 is subjected to polishing thinly from its back surface to about 100 μm, and thereafter a remaining SiO$_2$ section is removed by HF to leave only the silicon single crystal film 2, thereby being able to form the pellicle film 11.

When the support substrate is the SOI substrate in a limited sense, firstly, the silicon substrate 1a, which is the support substrate, is made thin to about 100 μm, and then the remaining silicon section is removed with etching by KOH etchant to expose the oxide film 1b, and thereafter the oxide film 1b is removed by HF to leave only the silicon single crystal film 2, thereby forming the pellicle film 11.

Finally, a ULPA filter was mounted to the pellicle frame 12 which is integrated with the pellicle film 11 of the silicon single crystal film. Moreover, a silicone adhesive was injected into the groove provided in the outermost periphery on the back surface of the pellicle frame 12, and thus the pellicle 10 was formed. This groove is a groove for shielding the silicone adhesive from exposure light.

Like the present invention, if a pellicle film consisting of a silicon single crystal film having an orientation plane as its principal plane is formed, the orientation plane with a crystal orientation inclined at 3 to 5° (3° off to 5° off) from <111> to <110> direction using the SOI substrate (the SOQ substrate, the SOG substrate, the SOI substrate in a limited sense), then extreme stress is not applied in process that forms the pellicle film of the silicon crystal film alone by removing the support substrate, and distortion is not also introduced since formation of the pellicle film is completed under a temperature on the order of room temperature. Furthermore, a cleavage and crack of the film do not easily occur. Moreover, the silicon single crystal has a high chemical resistance such as hydrofluoric acid resistance, and also hardly causes an etch pit and void.

The protection films, as shown in FIG. 1B, may be formed on the front and back surfaces of the pellicle film 11 of the silicon single crystal film which is supported by the pellicle frame 12 which is obtained as shown in FIG. 2D and FIG. 3D, and the protection film may be previously formed on the silicon single crystal film 2 before the support substrate is made into a thin film.

Example 2

According to processes shown in FIGS. 2A to 2D and FIGS. 3A to 3D, the pellicle film 11 of a silicon single crystal film having an orientation plane as its principal plane, the orientation plane with a crystal orientation inclined at 3 to 5° (3° off to 5° off) from <111> to <110> direction, the pellicle film 11 being supported by the pellicle frame 12, was obtained.

The pellicle film 11 of the silicon single crystal film of the EXAMPLE had a thickness of 20 nm. Then, a SiC thin film having a thickness of a few nm was deposited on each of the front surface and back surface of the pellicle film 11 by gas cluster ion beam evaporation method to coat the pellicle film 11 of the silicon single crystal film.

It was confirmed that every pellicle obtained by EXAMPLE 1 and EXAMPLE 2 had transmittance of EUV light of 50% or more, and throughput during EUV exposure that was on a practical level, and showed no degradation of yield of the device due to foreign matters at all.

In the above EXAMPLE, the pellicle film which is a single-crystal silicon film having a crystal plane as its principal plane, the crystal plane with a crystal orientation inclined at 3 to 5° from <111> to <110> direction (inclined at 3 to 5° from a lattice plane belonging to {111} planes to <110> direction), has been described. However, the principal plane of the silicon single crystal film may be a crystal plane inclined at 3 to 5° from any lattice plane belonging to {100} planes or {111} planes.

For example, a single-crystal silicon film having a crystal plane as its principal plane, the crystal plane with a crystal orientation inclined at 3 to 5° from <100> to <111> direction (inclined at 3 to 5° from a lattice plane belonging to {100} planes to <111> direction), may be used as the pellicle film.

As described above, the present invention provides a pellicle comprising a pellicle film for EUV having high transmission, and excellent mechanical and chemical stability, as well as having a high fabrication yield, and being practical also in cost.

What is claimed is:
1. A pellicle, comprising:
a silicon single crystal film as a pellicle film,
wherein a principal plane of the silicon single crystal film is a crystal plane inclined at 3 to 5° from any lattice plane belonging to {100} planes or {111} planes,
wherein when the lattice plane belongs to a {100} plane, the crystal plane is inclined at 3 to 5° in a <111> direction.
2. The pellicle according to claim 1, wherein the lattice plane belongs to the {111} planes, and the crystal plane is inclined at 3 to 5° in a <110> direction.
3. The pellicle according to claim 1, wherein the silicon single crystal film is obtained by making an SOI substrate into a thin film.
4. The pellicle according to claim 1, wherein the silicon single crystal film has an absorption coefficient of 0.005/nm or less for light having a wavelength of 13.5 nm.
5. The pellicle according to claim 1, comprising a protection film on at least one principal plane of the silicon single crystal film.
6. The pellicle according to claim 5, wherein the protection film has an absorption coefficient of 0.05/nm or less for light having a wavelength of 13.5 nm.
7. The pellicle according to claim 5, wherein the protection film consists of at least one material selected from the group consisting of SiC, SiO$_2$, Si$_3$N$_4$, SiON, Y$_2$O$_3$, YN, Mo, Ru, and Rh.
8. A method of producing a pellicle, comprising:
providing a pellicle film retaining portion on a top side of an SOI substrate comprising the top side and a bottom side, that has, on one principal plane, a silicon single crystal film having a crystal plane as its principal plane, the crystal plane being inclined at 3 to 5° from any lattice plane belonging to {100} planes or {111} planes; and
forming the silicon single crystal film as a pellicle film by removing a support substrate from the bottom side of the SOI substrate,
wherein when the lattice plane belongs to a {100} plane, the crystal plane is inclined at 3 to 5° in a <111> direction.
9. The method of claim 8, further comprising forming a protection film on at least one surface of the silicon single crystal film.
10. The method of claim 9, wherein the forming a protection film is performed by coating a film with at least one material selected from the group consisting of SiC, SiO$_2$, Si$_3$N$_4$, SiON, Y$_2$O$_3$, YN, Mo, Ru, and Rh.

11. The method of claim 10, wherein a coating method of the protection film is a gas cluster ion beam evaporation method.

12. The pellicle of claim 1, having a thickness of 20 to 150 nm.

13. The pellicle of claim 1, having a thickness of 20 to 70 nm.

14. The method of claim 8, wherein the pellicle has a thickness of 20 to 150 nm.

15. The method of claim 8, wherein the pellicle has a thickness of 20 to 70 nm.

16. The method of claim 8, wherein the lattice plane of the pellicle belongs to the {111} planes, and the crystal plane is inclined at 3 to 5° in a <110> direction.

17. The pellicle of claim 1, having an EUV transmittance of 50% or more.

18. The method of claim 8, wherein the pellicle has an EUV transmittance of 50% or more.

19. The pellicle of claim 1, wherein the lattice plane belongs to the {111} planes.

20. The method of claim 8, wherein the lattice plane of the pellicle belongs to the {111} planes.

* * * * *